United States Patent
Lue et al.

(10) Patent No.: US 12,073,883 B2
(45) Date of Patent: Aug. 27, 2024

(54) TERNARY CONTENT ADDRESSABLE MEMORY

(71) Applicant: MACRONIX International Co., Ltd., Hsinchu (TW)

(72) Inventors: Hang-Ting Lue, Hsinchu (TW); Teng-Hao Yeh, Hsinchu County (TW); Chih-Chang Hsieh, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 171 days.

(21) Appl. No.: 17/742,148

(22) Filed: May 11, 2022

(65) Prior Publication Data

US 2023/0368841 A1  Nov. 16, 2023

(51) Int. Cl.
*G11C 15/04* (2006.01)

(52) U.S. Cl.
CPC ................................. *G11C 15/04* (2013.01)

(58) Field of Classification Search
CPC ....................................................... G11C 15/04
See application file for complete search history.

(56) References Cited

U.S. PATENT DOCUMENTS

| 7,355,890 B1 | 4/2008 | Wen | |
|---|---|---|---|
| 8,169,808 B2 | 5/2012 | Roohparvar | |
| 2009/0190404 A1* | 7/2009 | Roohparvar | G11C 16/0483 365/49.17 |
| 2014/0241092 A1* | 8/2014 | Ha | G11C 11/5621 365/230.03 |
| 2018/0197592 A1 | 7/2018 | Katayama et al. | |
| 2019/0221262 A1 | 7/2019 | Ma et al. | |
| 2020/0219547 A1 | 7/2020 | Ma et al. | |
| 2021/0090645 A1 | 3/2021 | Inaba et al. | |
| 2022/0319597 A1* | 10/2022 | Moyer | G11C 15/046 |

FOREIGN PATENT DOCUMENTS

| CN | 106158021 | 11/2016 |
|---|---|---|
| TW | I703578 | 9/2020 |
| TW | 202137704 | 10/2021 |

OTHER PUBLICATIONS

"Office Action of Taiwan Counterpart Application", issued on Feb. 9, 2023, p. 1-p. 4.
Po-Hao Tseng et al., "In-Memory-Searching Architecture Based on 3D-NAND Technology with Ultra-high Parallelism," 2020 IEEE International Electron Devices Meeting (IEDM), Dec. 2020, pp. 1-4.
"Office Action of Taiwan Related Application, Application No. 112116358", issued on Oct. 31, 2023, p. 1-p. 7.
"Office Action of Taiwan Related Application No. 112116358", issued on Jan. 8, 2024, pp. 1-6.

* cited by examiner

*Primary Examiner* — Anthan Tran
(74) *Attorney, Agent, or Firm* — J.C. PATENTS

(57) ABSTRACT

A ternary content addressable memory, disposed in a stacked memory device, includes a first memory cell string and a second memory cell string. The first memory cell string is coupled between a matching line and a first source line and receives multiple first word line signals. The first memory cell string has a first memory cell string selection switch controlled by a first search signal. The second memory cell string is coupled between the matching line and a second source line and receives multiple second word line signals. The second memory cell string has a second memory cell string selection switch controlled by a second search signal.

17 Claims, 9 Drawing Sheets

| | SB-1 | SB-2 | SB-3 | SB-4 | SB-5 | SB-6 | SB-7 | SB-8 | SB-9 | SB-10 | SB-11 | SB-12 | SB-13 | SB-14 | SB-15 | SB-16 | SB-17 | SB-18 | SB-19 | SB-20 | SB-21 | SB-22 | SB-23 | SB-24 | SB-25 | SB-26 | SB-27 | SB-28 | SB-29 | SB-30 | SB-31 | SB-32 | Counter |
|---|---|---|---|---|---|---|---|---|---|---|---|---|---|---|---|---|---|---|---|---|---|---|---|---|---|---|---|---|---|---|---|---|---|
| | Wildcard | Group-1 | | | | | | | Wildcard | Group-2 | | | | | | | Group-3 | | | | | | | | Group-4 | | | | | | | | |
| Input | 1 | 0 | 1 | 1 | 0 | 0 | 0 | 1 | 1 | 1 | 0 | 0 | 0 | 1 | 1 | 0 | 1 | 1 | 0 | 1 | 1 | 1 | 0 | 1 | 0 | 0 | 1 | 1 | 1 | 1 | 0 | 0 | |
| PB-1 | 1 | 0 | 1 | 1 | 0 | 0 | | 1 | 1 | 0 | 0 | 0 | 1 | 1 | 0 | 1 | 1 | 0 | 1 | 1 | 1 | 0 | 1 | 1 | 0 | 1 | 1 | 1 | 1 | 0 | 0 | 2 |
| PB-2 | 0 | 0 | 1 | 1 | 0 | 0 | | 1 | 1 | 0 | 0 | 1 | 0 | 0 | 1 | 1 | 0 | 1 | 1 | 1 | 0 | 1 | 1 | 0 | 0 | 1 | 1 | 1 | 1 | 0 | 0 | 1 |
| ⋮ | | | | | | | | | | | | | | | | | | | | | | | | | | | | | | | | | ⋮ |
| PB-60 | 1 | 0 | 1 | 1 | 0 | 0 | | 1 | 1 | 0 | 0 | 0 | 1 | 1 | 0 | 1 | 1 | 0 | 1 | 1 | 1 | 0 | 1 | 0 | 0 | 1 | 1 | 1 | 1 | 0 | 0 | 0 |
| ⋮ | | | | | | | | | | | | | | | | | | | | | | | | | | | | | | | | | ⋮ |
| PB-511 | 1 | 0 | 1 | 1 | 0 | 0 | | 1 | 1 | 0 | 0 | 0 | 0 | 0 | 1 | 1 | 0 | 1 | 1 | 1 | 0 | 1 | 0 | 0 | 1 | 1 | 1 | 1 | 0 | 0 | 1 |
| PB-512 | 1 | 0 | 1 | 1 | 0 | 0 | | 1 | 1 | 0 | 0 | 0 | 0 | 0 | 1 | 1 | 0 | 1 | 1 | 1 | 0 | 1 | 0 | 0 | 1 | 1 | 1 | 1 | 0 | 1 | 1 |

FIG. 7

TERNARY CONTENT ADDRESSABLE MEMORY

BACKGROUND

Technology Field

The disclosure relates to a ternary content addressable memory, and more particularly, to a ternary content addressable memory that improves search bandwidth.

Description of Related Art

Ternary content addressable memories can be constructed by using inverse-OR flash memory cell pairs. The inverse-OR flash memory cell pairs use word lines or original lines to receive search signals. This architecture requires higher voltages for read operations. Moreover, in a ternary content addressable memory under the inverse-OR flash memory cell architecture, when more source line switches are turned on, the memory cell pairs determined to be un-match may allow larger currents to be generated in the ternary content addressable memory. Moreover, in actual circuit operation, this excessive current may be clamped by the surrounding bit lines and source line switches, resulting in the problem of incorrect search results.

SUMMARY

The disclosure provides a variety of ternary content addressable memories capable of improving the bandwidth of data search operations.

A ternary content addressable memory of the disclosure includes a first memory cell string and a second memory cell string. The first memory cell string is coupled between a matching line and a first source line and receives multiple first word line signals. The first memory cell string has a first memory cell string selection switch, and the first memory cell string selection switch is controlled by a first search signal. The second memory cell string is coupled between the matching line and the first source line and receives multiple second word line signals. The second memory cell string has a second memory cell string selection switch, and the second memory cell string selection switch is controlled by a second search signal.

Another ternary content addressable memory of the disclosure includes multiple memory cell string pairs. The memory cell string pairs receive multiple pieces of search data, respectively. Each of the memory cell string pairs includes a first memory cell string and a second memory cell string. The first memory cell string is coupled between a matching line and a first source line and receives multiple first word line signals. The first memory cell string has a first memory cell string selection switch, and the first memory cell string selection switch is controlled by a first search signal. The second memory cell string is coupled between the matching line and the first source line and receives multiple second word line signals. The second memory cell string has a second memory cell string selection switch, and the second memory cell string selection switch is controlled by a second search signal.

In summary, the ternary content addressable memories of the disclosure perform the search operation for search data through the paired first memory cell string and the second memory cell string. The first memory cell string and the second memory cell string receive the paired first search signal and the second search signal by the first memory cell string selection switch and the second memory cell string selection switch, respectively. The ternary content addressable memories of the disclosure can perform search operations for multiple pieces of search data by the memory cell string pairs, thereby effectively increasing the bandwidth of the search operations.

BRIEF DESCRIPTION OF THE DRAWING

FIG. 7 illustrates a schematic plot of an approximation search mode for the ternary content addressable memory according to an embodiment of present disclosure.

DESCRIPTION OF THE EMBODIMENTS

Figure 1:
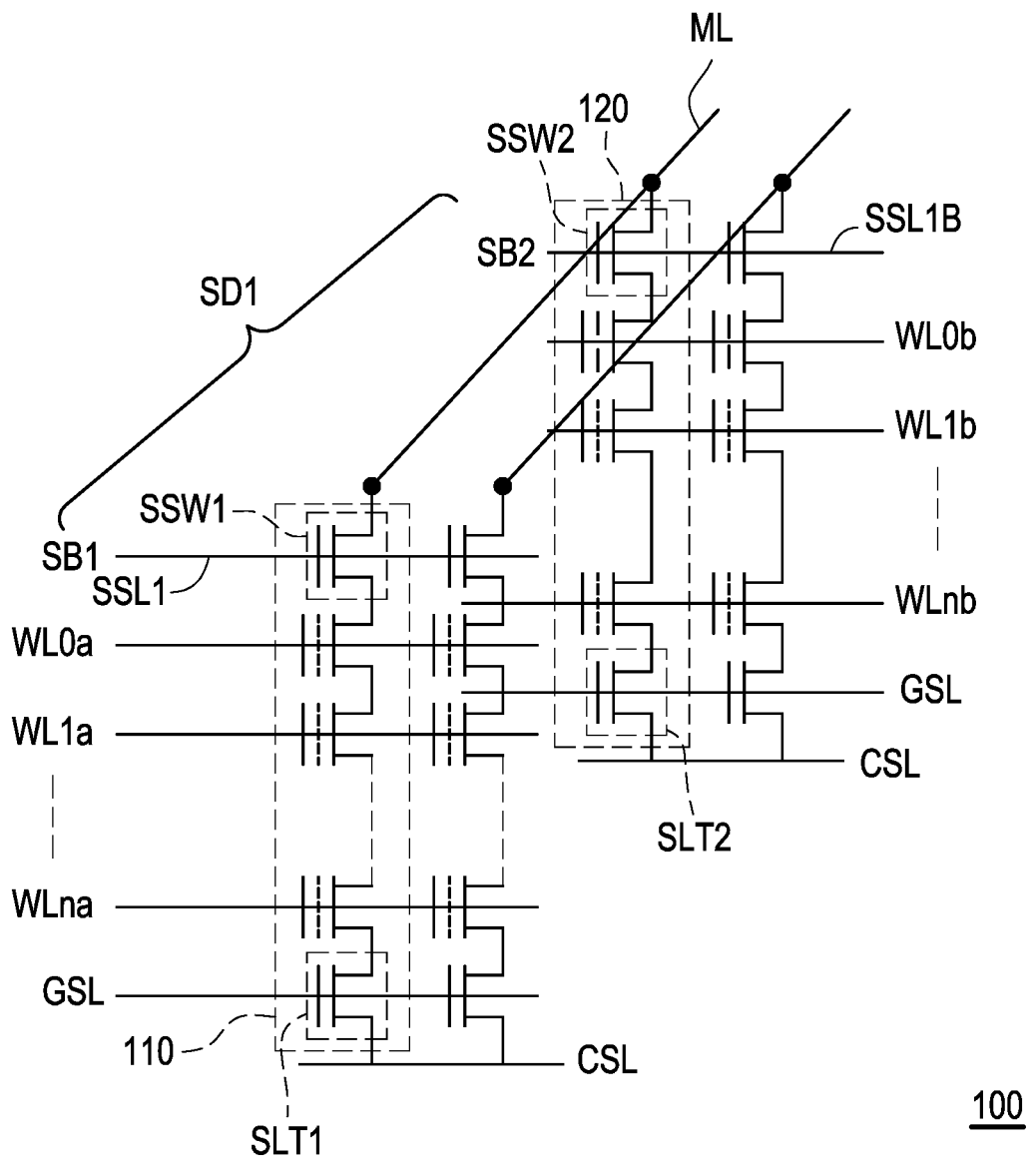
FIG. 1 is a schematic view of a ternary content addressable memory according to an embodiment of the disclosure.

Referring to FIG. 1. FIG. 1 is a schematic view of a ternary content addressable memory according to an embodiment of the disclosure. A ternary content addressable memory 100 includes memory cell strings 110 and 120. Memory cell strings 110 and 120 form a memory cell string pair. The memory cell string 110 is coupled between a matching line ML and a source line CSL, and the memory cell string 110 has multiple memory cells. The memory cells are coupled to multiple word lines WL0a to WLna, respectively. The memory cell string 110 has a memory cell string selection switch SSW1 and a source line switch SLT1. Multiple memory cells of the memory cell string 110 are connected in series between the memory cell string selection switch SSW1 and the source line switch SLT1, coupled to the matching line ML through the memory cell string selection switch SSW1, and coupled to the source line CSL through the source line switch SLT1.

Moreover, the memory cell string 120 is coupled between the matching line ML and the source line CSL, and the memory cell string 120 has multiple memory cells. The memory cells are coupled to multiple word lines WL0b to WLnb, respectively. The memory cell string 120 has a memory cell string selection switch SSW2 and a source line switch SLT2. Multiple memory cells of the memory cell string 120 are connected in series between the memory cell string selection switch SSW2 and the source line switch SLT2, coupled to the matching line ML through the memory cell string selection switch SSW2, and coupled to the source line CSL through the source line switch SLT2.

In the embodiment, the control terminals of the memory cell string selection switches SSW1 and SSW2 are coupled to memory cell string selection lines SSL1 and SSL1B, respectively and receive search signals SB1 and SB2, respectively. The search signals SB1 and SB2 can be generated according to search data SD1. For example, if the search data SD1 is at a logic high level or a logic low level, the search signals SB1 and SB2 can be two complementary logic levels, respectively; if the search data SD1 is a wild card signal (or don't care), the search signals SB1 and SB2 can be at the same logic low level. The source line switches SLT1 and SLT2 are controlled by a control signal GSL.

In other embodiments, the multiple word lines WL0a to WLna coupled to the memory cell string 110 and the multiple word lines WL0b to WLnb coupled to the memory cell string 120 may be the same word lines.

When performing the search operation, one of the word lines WL0a to WLna is set as the selected word line. The selected word line receives the enabled word line signal while the remaining unselected word lines receive word line signals equal to the pass voltage. Similarly, one of the word lines WL0b to WLnb is set as the selected word line. The selected word line receives the enabled word line signal while the remaining unselected word lines receive word line signals equal to the pass voltage.

Meanwhile, the memory cell string 110 generates a first comparison result according to the data in the selected memory cell and the search signal SB1, and the memory cell string 120 generates a second comparison result according to the data in the selected memory cell and the search signal SB2. The matching signal on the matching line ML can be determined according to the first comparison result and the second comparison result.

Note that the memory cell strings 110 and 120 may be disposed in a stacked memory cell array, such as a stacked flash memory cell array.

Figure 2A:
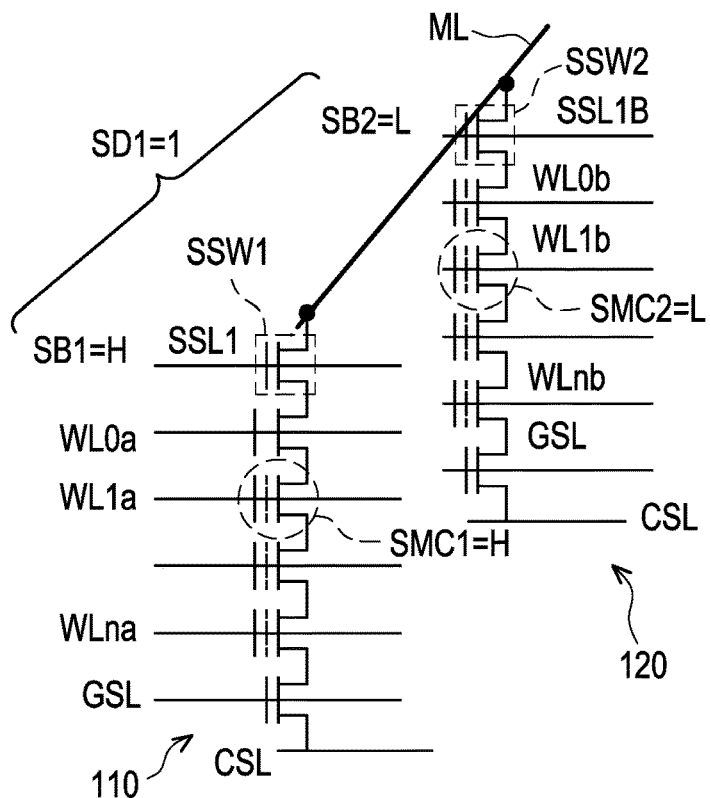
FIG. 2A to FIG. 2F are schematic views illustrating search operations of a ternary content addressable memory according to an embodiment of the disclosure.

For the implementation details of the search operation, refer to the schematic views of the search operation of the ternary content addressable memory according to the embodiment of the disclosure in FIG. 2A to FIG. 2F. In the embodiment, the memory cell string 110 can determine whether to provide a first current between the matching line ML and the source line CSL according to the generated first comparison result. Similarly, the memory cell string 120 can determine whether to provide a second current between the matching line ML and the source line CSL according to the generated second comparison result. In FIG. 2A, a threshold voltage of the selected memory cell SMC1 is at a high state, and a threshold voltage of the selected memory cell SMC2 is at a low state. That is, a data stored in a selected memory cell SMC1 is at a logic high level (H) and data stored in a selected memory cell SMC2 is at a logic low level (L). When the search data SD1 is at a search level ("1"), the search signals SB1 and SB2 can be at the logic high level (H) and the logic low level (L), respectively. Meanwhile, the memory cell string selection switch SSW2 can be cut off so that the memory cell string 120 is cut-off and does not provide the second current. The memory cell string selection switch SSW1 can be turned on, and since the data stored in a selected memory cell SMC1 is at a logic high level (H), the memory cell string 110 is cut-off and does not provide the first current. In the embodiment, the memory cells SMC1 and SMC2 are in cooperation to store the storage data level ("1").

In the embodiment, the search signals SB1 and SB2 match the data stored in the selected memory cells SMC1 and SMC2, respectively, so the result of the search operation should be match. However, since both the memory cell strings 110 and 120 do not provide the first current and the second current, a sensing circuit coupled to the matching line ML will not sense the current then determines that the current search operation is match. In other embodiments, the voltage level of the matching signal on the matching line ML does not change. In the state when the voltage level of the matching signal on the matching line ML has not changed, it can be determined that the current search operation is match.

Furthermore, before the search operation, the matching signal on the matching line ML can be pre-charged to a relatively high reference voltage. During the search operation, when both the memory cell strings 110 and 120 do not provide the first current and the second current, the matching signal on the matching line ML can remain equal to the reference voltage.

Figure 2B:
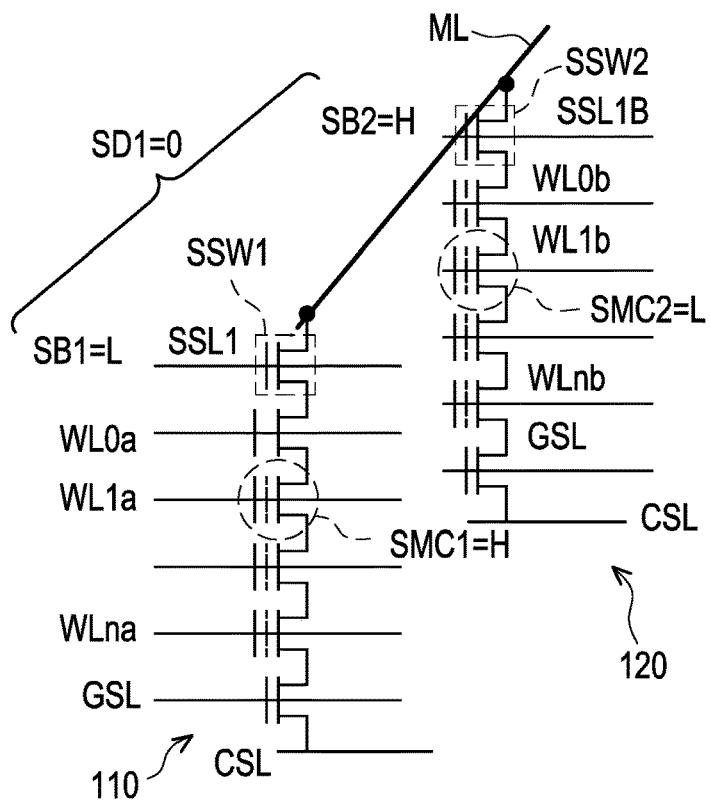

In FIG. 2B, the data stored in the selected memory cell SMC1 is at the logic high level (H), and the data stored in the selected memory cell SMC2 is at the logic low level (L). When the search data SD1 is at a search data level ("0"), the search signals SB1 and SB2 can be at the logic low level (L) and the logic high level (H), respectively. Meanwhile, the memory cell string selection switch SSW1 can be cut off so that the memory cell string 110 is cut-off and does not provide the first current. The memory cell string selection switch SSW2 can be turned on, and since the data stored in the selected memory cell SMC2 is at the logic low level (L), the memory cell string 120 can provide the second current. In the embodiment, the selected memory cells SMC1 and SMC2 are in cooperation to store the storage data level ("1").

In the embodiment, the search signals SB1 and SB2 do not match the data stored in the selected memory cells SMC1 and SMC2, respectively, so the result of the search operation should be an un-match. A sensing circuit coupled to the matching line ML can sense the current then determines that the current search operation is un-match. In other embodiments, based on the second current that the memory cell string 120 can provide, the voltage level of the matching signal on the matching line ML can be pulled down to a relatively low reference voltage (e.g., equal to a ground voltage). In the state when the voltage level of the matching signal on the matching line ML is pulled down, it can be determined that the current search operation is an un-match.

Figure 2C:
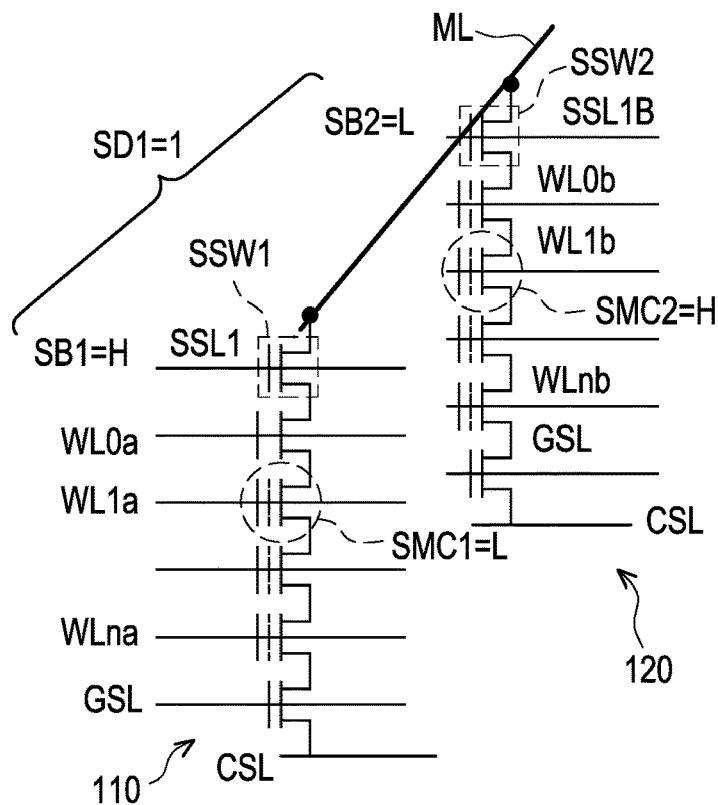

In FIG. 2C, the selected memory cells SMC1 and SMC2 are in cooperation to store the storage data level ("0"), and the selected memory cells SMC1 and SMC2 are stored as the data of the logic low level (L) and the data of the logic high level (H), respectively. When the search data SD1 is at a search data level ("1"), the search signals SB1 and SB2 can be at the logic high level (H) and the logic low level (L), respectively. Meanwhile, the memory cell string selection switch SSW2 can be cut off so that the memory cell string 120 is cut-off and does not provide the second current. The memory cell string selection switch SSW1 can be turned on, and since the data stored in the selected memory cell SMC1 is at a logic low level (L), the memory cell string 110 can provide the first current.

In the embodiment, the search signals SB1 and SB2 do not match the data stored in the selected memory cells SMC1 and SMC2, respectively, so the result of the search operation should be an un-match. A sensing circuit coupled to the matching line ML can sense the current then determined that the current search operation is un-match. In other embodiments, based on the first current that the memory cell string 110 can provide, the voltage level of the matching signal on the matching line ML can be pulled down to a relatively low reference voltage (e.g., equal to the ground voltage). In the state when the voltage level of the matching signal on the matching line ML is pulled down, it can be determined that the current search operation is an un-match.

Figure 2D:
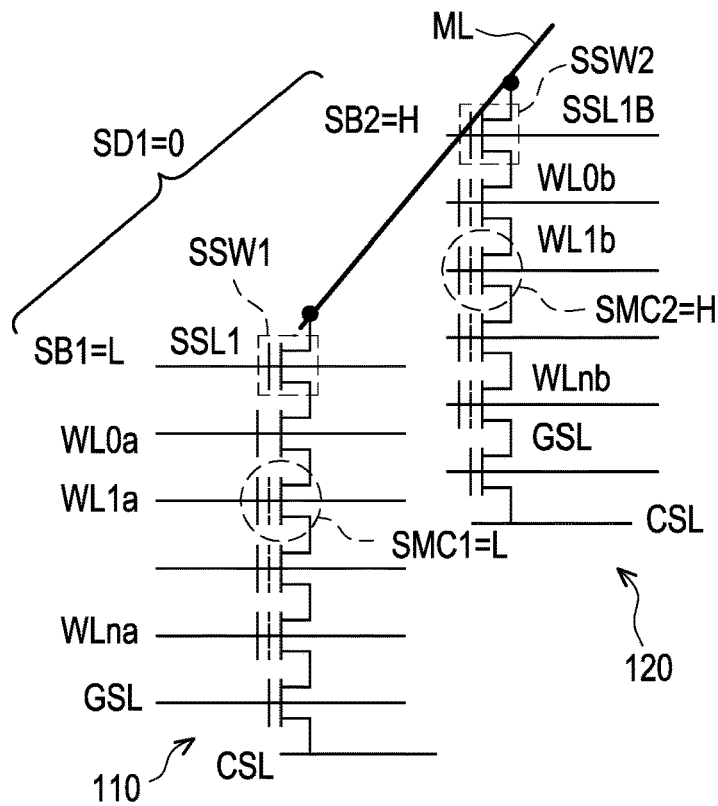

In FIG. 2D, the selected memory cells SMC1 and SMC2 are in cooperation to store the storage data level ("0"), and the selected memory cells SMC1 and SMC2 are stored as the data of a logic low level (L) and the data of a logic high level (H), respectively. When the search data SD1 is at a search level ("0"), the search signals SB1 and SB2 can be at the logic low level (L) and the logic high level (H), respectively. Meanwhile, the memory cell string selection switch SSW1 can be cut off so that the memory cell string 110 is cut-off and does not provide the first current. The memory cell string selection switch SSW2 can be turned on, and since the data stored in the selected memory cell SMC2 is at the logic high level (H), the memory cell string 120 is cut-off and does not provide the second current.

In the embodiment, the search signals SB1 and SB2 match the data stored in the selected memory cells SMC1 and SMC2, respectively, so the result of the search operation should be match. However, since the memory cell strings 110 and 120 do not provide the first current and the second current, a sensing circuit coupled to the matching line ML will not sense the current then determines that the current search operation is match. In other embodiments, the voltage level of the matching signal on the matching line ML remains equal to the relatively high reference voltage. In the state when the voltage level of the matching signal on the matching line ML is not pulled down, it can be determined that the current search operation is match.

Figure 2E:
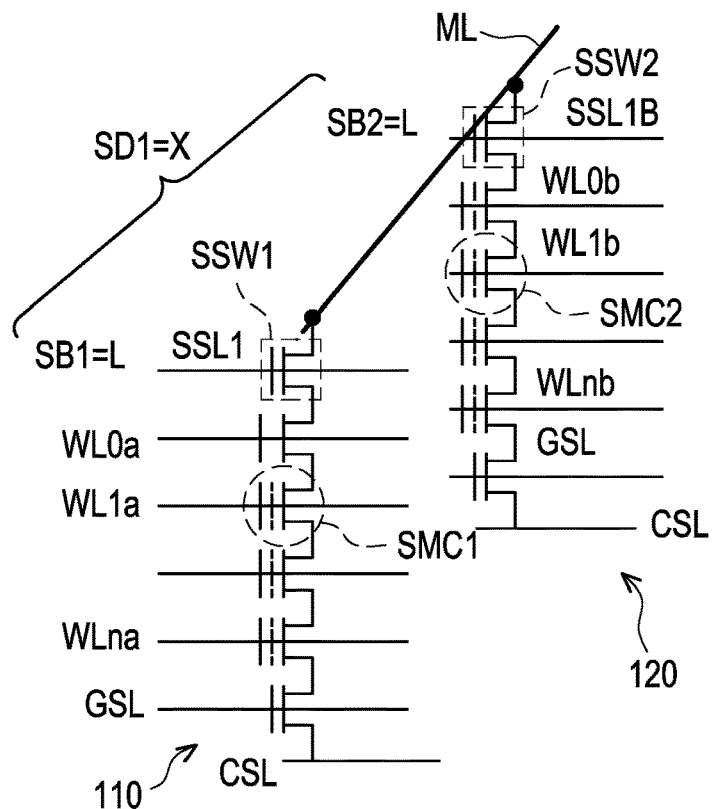

In FIG. 2E, the selected memory cells SMC1 and SMC2 are in cooperation to store the storage data equal to any storage data level. When the search data SD1 is a wild card signal (X), both the search signals SB1 and SB2 can be logic low levels (L). Meanwhile, the memory cell string selection switches SSW1 and SSW2 are both cut-off, so that the memory cell strings 110 and 120 are cut-off and do not provide the first current and the second current.

In the embodiment, regardless of the data stored in the selected memory cells SMC1 and SMC2, the result of the search operation is match. However, since the memory cell strings 110 and 120 do not provide the first current and the second current, a sensing circuit couple to the matching line ML will not sense the current then determined that the current search operation is match. In other embodiments, the voltage level of the matching signal on the matching line ML remains equal to the relatively high reference voltage. In the state when the voltage level of the matching signal on the matching line ML is not pulled down, it can be determined that the current search operation is match.

Figure 2F:
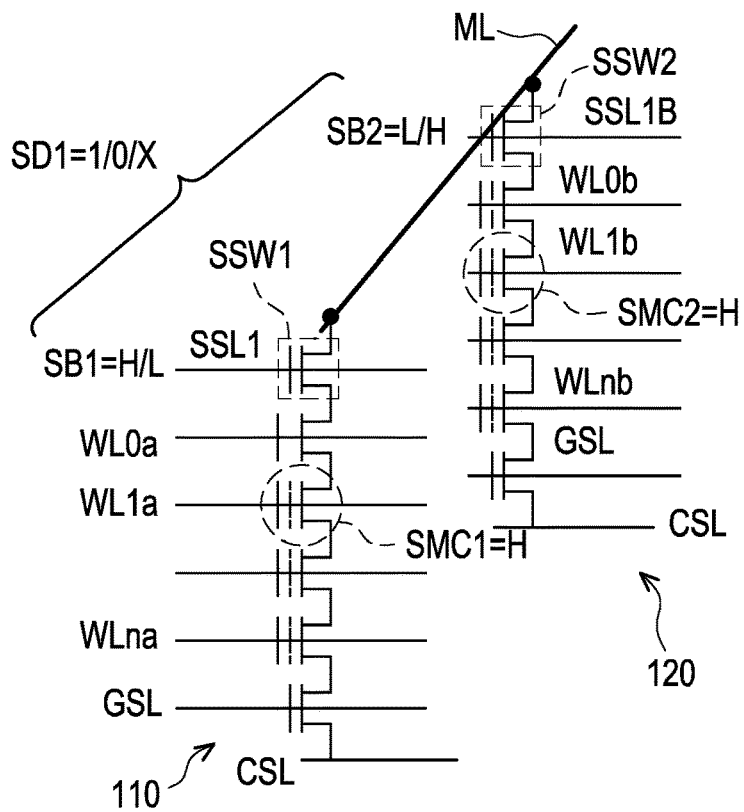

In FIG. 2F, the selected memory cells SMC1 and SMC2 are in cooperation to store the storage data of the wild card signal. Meanwhile, the selected memory cells SMC1 and SMC2 both store the data equal to a logic high level (H). Whether the search data SD1 is a search data level ("1"), a search data level ("2"), or a wild card signal (X) (the search signals SB1 and SB2 can be a logic low level (L) or a logic high level (H)), the memory cell strings 110 and 120 do not provide the first current and second current.

In the embodiment, regardless of the logic levels of the search signals SB1 and SB2, the result of the search operation is match. However, since the memory cell strings 110 and 120 do not provide the first current and the second current, a sensing circuit coupled to the matching line ML will not sense the current then determines that the current search operation is match. In other embodiments, the voltage level of the matching signal on the matching line ML remains equal to the relatively high reference voltage. In the state when the voltage level of the matching signal on the matching line ML is not pulled down, it can be determined that the current search operation is match.

A truth table of the ternary content addressable memory 100 can be shown as a table 1 (shown as below):

TABLE 1

| | SB1=H, SB2=L (Search Data "1") | SB1=L, SB2=H (Search Data "0") | SB1=L, SB2=L (Search Data "X") |
|---|---|---|---|
| SMC1=H SMC2=L (Storage Data "1") | Match (No current) | Un-match (With current) | Match (No current) |
| SMC1=L SMC2=H (Storage Data "0") | Un-match (With current) | Match (No current) | Match (No current) |
| SMC1=H SMC2=H (Storage Data "X") | Match (No current) | Match (No current) | Match (No current) |

Note that, in the embodiment of the disclosure, the memory cell string provides currents only when the search result is an un-match. In the state when the search result is match, the memory cell string does not provide currents. Therefore, in the embodiment, there is no read disturbance caused by the current generated by the search result when it is match. Moreover, in the un-match state, the state of currents is something that the designer need not to care about. Moreover, in the embodiment, the read operation for the memory cells in the memory cell string is the same as the read method of the memory cells of a general single level cell (SLC) storage unit, and there is no so-called back-pattern loading effect.

Moreover, since the memory cell string similarly provides currents only when the search result is an un-match in the embodiment of the disclosure, when determining the matching state of the multi-data search operation, the sum of the currents generated by the memory cell string can be simply determined as the number of un-matches in the search results.

Figure 3:
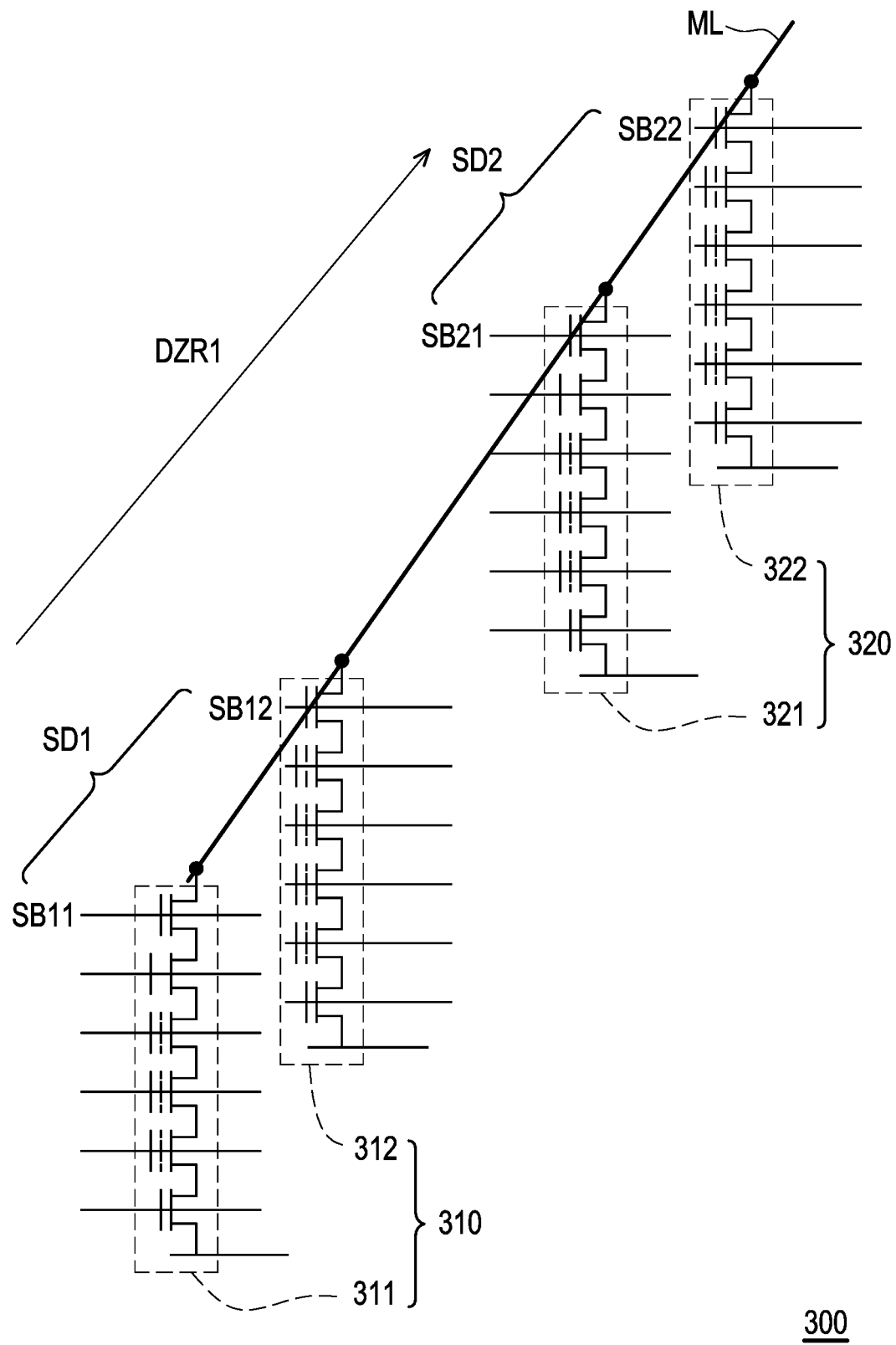
FIG. 3 is a schematic view of a ternary content addressable memory according to another embodiment of the disclosure.

In the subsequent paragraphs, refer to FIG. 3. FIG. 3 is a schematic view of a ternary content addressable memory according to another embodiment of the disclosure. In the embodiment, a ternary content addressable memory 300 includes multiple memory cell string pairs 310 and 320. The memory cell string pair 310 includes memory cell strings 311 and 312, and the memory cell string pair 320 includes memory cell strings 321 and 322. The memory cell strings 311, 312, 321, and 322 are coupled to the same matching line ML. The memory cell strings 311 and 312 are configured to perform a search operation for the search data SD1, and the memory cell strings 321 and 322 are configured to perform a search operation for search data SD2. When the memory cell strings 311 and 312 perform the search operation for the search data SD1, the memory cell strings 321 and 322 do not perform the operation, and when the memory cell strings 321 and 322 perform the search operation for the search data SD2, the memory cell strings 311 and 312 do not perform the operation.

In the embodiment, when performing the search operation for multiple bits, the search operation of the multiple pieces of the search data SD1 to SD2 may be sequentially performed according to a reference direction DZR1.

Note that when the result of the search operation performed for the search data SD1 is match, the voltage of the matching signal on the matching line ML can be maintained in a state of not being pulled down. Accordingly, the ternary content addressable memory 300 can quickly perform the search operation of the next data (the search data SD2). If the result of the search operation performed for the search data SD2 is an un-match, the voltage of the matching signal on the matching line ML can be pulled down, and the ternary content addressable memory 300 can stop the subsequent search operation.

The circuit architectures of the memory cell strings 311, 312, 321, and 322 in the embodiment are the same as the architectures of the memory cell strings in the foregoing embodiment, which are not repeated herein.

Furthermore, the memory cell string pairs 310 and 320 may respectively receive the search data SD1 to SD2 in different time phases.

Figure 4:
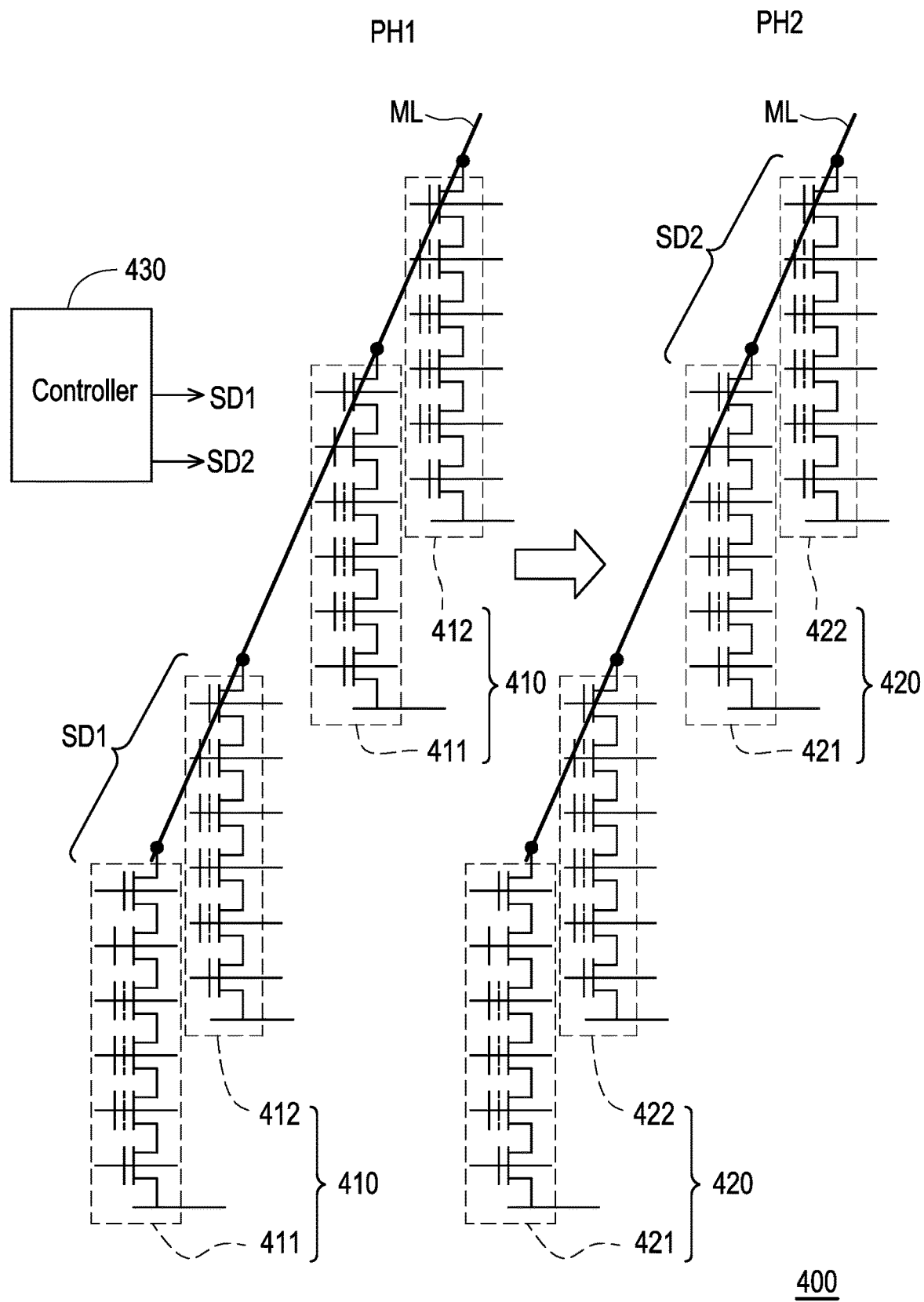
FIG. 4 is a schematic view illustrating an implementation of a search operation of a ternary content addressable memory in multiple phases according to an embodiment of the disclosure.

In the subsequent paragraphs, refer to FIG. 4. FIG. 4 is a schematic view illustrating an implementation of a search operation of a ternary content addressable memory in multiple phases according to an embodiment of the disclosure. In FIG. 4, a ternary content addressable memory 400 includes multiple memory cell string pairs 410 and 420. The memory cell string pair 410 includes memory cell strings 411 and 412, and the memory cell string pair 420 includes memory cell strings 421 and 422. The memory cell strings 411, 412, 421, and 422 are coupled to the same matching line ML. In the embodiment, a controller 430 is coupled to the memory cell strings 411, 412, 421, and 422 for providing the search data SD1 and SD2.

In the embodiment, the search operation can be performed in a multi-phase manner. In a first phase PH1, the controller 430 can provide the memory cell strings 411 and 412 with the search data SD1 and control the memory cell strings 411 and 412 to perform a search operation for the search data SD1. In the first phase PH1, the memory cell strings 421 and 422 do not perform the search operation but may be in an idle state.

Then, in a second phase PH2 after the first phase PH1, the controller 430 can provide the memory cell strings 421 and 422 with the search data SD2 and control the memory cell strings 421 and 422 to perform a search operation for the search data SD2. In the second phase PH2, the memory cell strings 411 and 412 do not perform the search operation but may be in an idle state.

Note that in a stacked flash memory architecture, the setting operation of the word line signal received by the memory cell takes a long time. Therefore, in the embodiment, with the multi-phase search method, search operations for the multiple pieces of search data can be completed without repeating the setting operation of the word line signal, which can effectively increase the data search bandwidth.

On the other hand, in the embodiment of the disclosure, the search data SD1 to SD2 generated by the controller 430 can be adjusted according to different search modes. When the search mode is a precise search mode, the controller 430 can control each piece of the generated search data SD1 to SD2 to be at a precise logic state "1" or "0.". On the contrary, when the search mode is an approximation search mode, the controller 430 can control at least one piece of the generated search data SD1 to SD2 to be a wild card signal.

Meanwhile, the controller 430 may set a specific piece of search data as the wild card signal or may randomly select any one piece or both pieces of the search data SD1 to SD2 to be the wild card signal, which is not limited.

Note that the user can choose from the precise search mode or the approximation search mode for the ternary content addressable memory 400 according to actual requirements, which is not limited.

Meanwhile, the controller 430 can be any control logic circuit with computing capability, such as a memory control circuit well known to those skilled in the art, and its hardware structure is not limited in any way.

Figure 5:
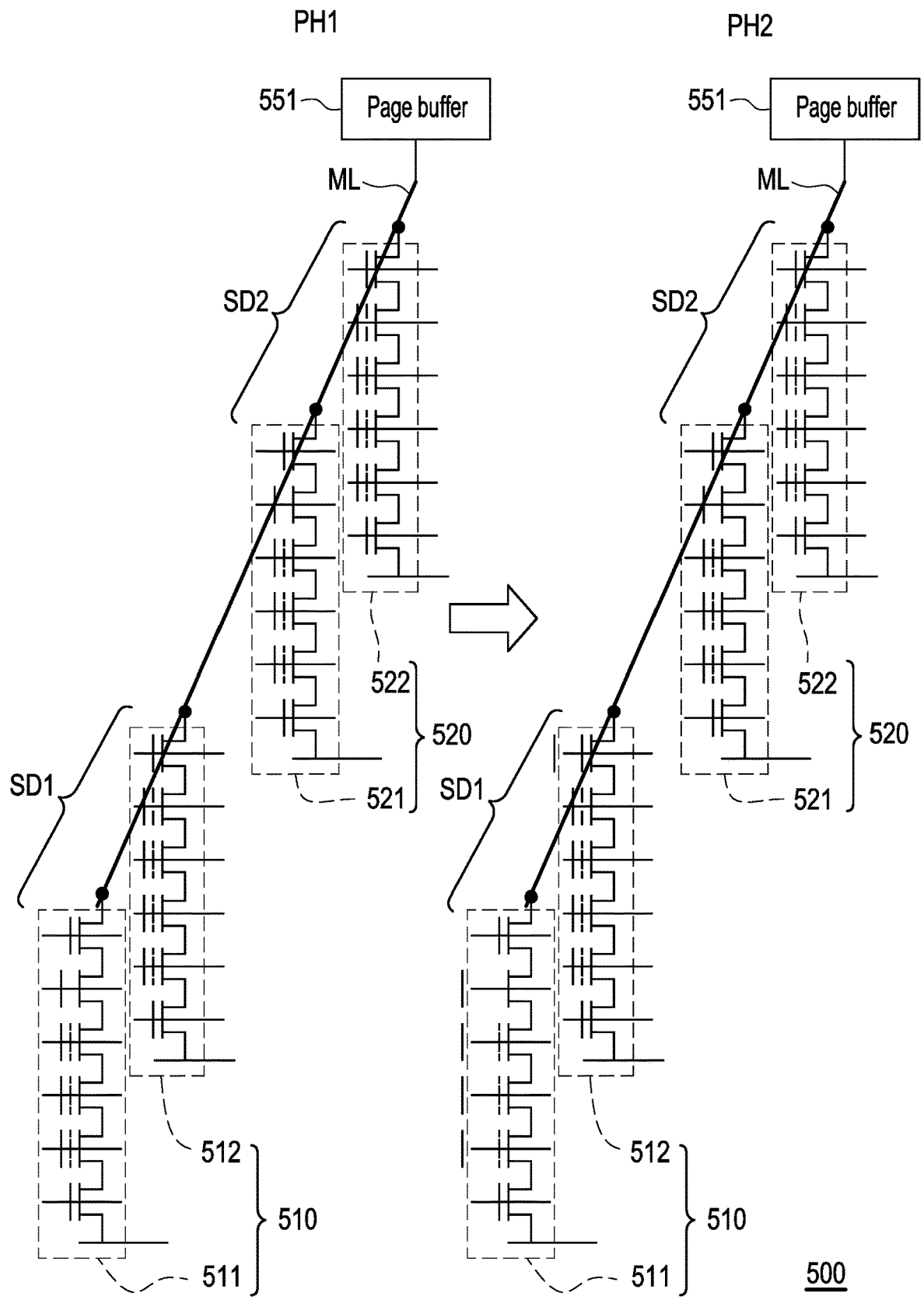
FIG. 5 is a schematic view of a ternary content addressable memory according to another embodiment of the disclosure.

In the subsequent paragraphs, refer to FIG. 5. FIG. 5 is a schematic view of a ternary content addressable memory according to another embodiment of the disclosure. A ternary content addressable memory 500 includes multiple memory cell string pairs 510 and 520 and a page buffer 551. The memory cell string pair 510 includes memory cell strings 511 and 512, and the memory cell string pair 520 includes memory cell strings 521 and 522. The architectures of the memory cell strings 511, 512, 521, and 522 are the same as the architectures of the memory cell strings 110 and 120 in the embodiment of FIG. 1, which are not repeated herein. The page buffer 551 is coupled to the matching line ML. The page buffer 551 has a sense amplifier circuit and multi-level cache memory elements. The sense amplifier circuit is configured to sense the matching signal on the matching line ML to determine whether the search result is match or un-match. The multi-level cache elements in the page buffer 551 are configured to store multiple cache values and a final cache value, respectively. The cache value corresponds to the search result of the search operation performed by the ternary content addressable memory 500 in each phase, and the final cache value corresponds to the final search result of the search operation of multiple phases.

In the embodiment, in the search operation of the first phase PH1, the memory cell strings 511 and 512 may perform the search operation for the search data SD1 and store the search result as a first cache value L1. For example, both the cache value and the final cache value may have initial values of logic high level. During the search operation of the first phase PH1, the search result of the search operation of the memory cell strings 511 and 512 on the search data SD1 is match, and the first cache value L1 can be changed to be equal to the logic low level.

In the embodiment, the first cache value L1, a second cache value L2, and a final cache value L3 are recorded in the page buffer 551 as an example. The second cache value L2 is initially set to a logic high level. After the first cache value L1 is set, the final cache value L3 can be generated by performing logical operations on the first cache value L1 and the second cache value L2. The final cache value L3 can be generated by performing a logical AND operation on the inverse of the first cache value L1 and the second cache value L2. That is, when the first cache value L1 is at a logic low level and the second cache value L2 is at a logic high level, the final cache value L3 can be at a logic high level.

In the embodiment, the page buffer 551 can set the second cache value L2 according to the final cache value L3, that is, in the phase PH1, the second cache value L2 remains equal to the logic high level.

Then, the search operation of the second phase PH2 is performed, the memory cell strings 521 and 522 can perform the search operation for the search data SD2, and the first cache value L1 is equal to a new search result. During the search operation of the first phase PH1, the search result of the search operation of the memory cell strings 521 and 522 on the search data SD2 is un-match, and the first cache value L1 can be changed to a logic high level.

Since the first cache value L1 is changed to a logic high level, the final cache value L3 can be changed to a logic low level according to the logic operation performed by the page buffer 551.

Next, the page buffer 551 can set the second cache value L2 according to the final cache value L3, that is, in the phase PH2, the second cache value L2 can be changed to be equal to the logic low level.

According to the foregoing description, whether there is at least one un-match of the search results in the search operations of the ternary content addressable memory 500 in multiple phases can be acquired according to whether the final cache value L3 is a logic low level. When the final cache value L3 remains a logic high level, it means that there is no un-match of the search results in the search operations of the ternary content addressable memory 500 in multiple phases. On the other hand, if the final cache value L3 is equal to the logic low level, it means that there is at least one un-match of the search results in the search operations of the ternary content addressable memory 500 in multiple phases.

Figure 6:
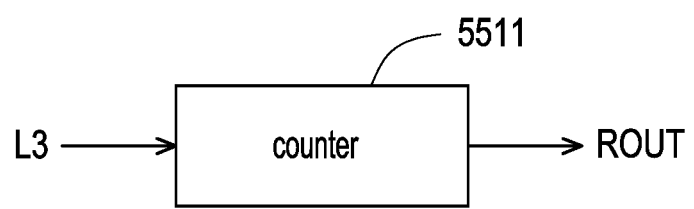
FIG. 6 is a schematic view of a page buffer in the ternary content addressable memory of FIG. 5 according to another embodiment of the disclosure.

In the subsequent paragraphs, refer to FIG. 6. FIG. 6 is a schematic view of a page buffer in the ternary content addressable memory of FIG. 5 according to another embodiment of the disclosure. In the embodiment, the page buffer 551 further includes a counter 5511. The counter 5511 can receive the first cache value L1, and count the number of times when the first cache value L1 is equal to a specific logic level (either a logic low level or a logic high level) in multiple search operations.

When the counter 5511 counts the number of times when the first cache value L1 is equals to the logic high level in multiple search operations, the number of matches between the multiple pieces of the search data SD1 and SD2 and the data (the searched target data) stored in the memory cell strings 511 to 522 can be acquired, and accordingly a similarity ROUT between the multiple pieces of the search data SD1 and SD2 and the searched target data can be calculated.

Relatively, when the counter 5511 counts the number of times when the first cache value L1 is equal to the logic high level in multiple search operations, the number of matches between the multiple pieces of the search data SD1 and SD2 and the data (the searched target data) stored in the memory cell strings 511 to 522 can be acquired, and accordingly the dissimilarity between the multiple pieces of the search data SD1 and SD2 and the searched target data can be calculated.

If a counting result of the counter 5511 is same as a threshold number, an overflow event can be triggered. When a counting operation of the counter 5511 is overflow, the searching operations to the currently page buffer 551 may be stopped to reduce a power consumption.

In some embodiments, if the counting result corresponding to the page buffer 551 is smaller than a preset threshold value, data stored in corresponding memory cells having higher reliability can be determined, and the stored data stored can be sent to a memory and/or a processor for continuously computing.

The counter 5511 can be implemented with any form of logic counting circuit without a certain limitation.

Referring back to FIG. 5, in the embodiment of FIG. 5, the ternary content addressable memory 500 may have multiple matching lines, and multiple page buffers corresponding to the matching lines are disposed, respectively. In an example with N page buffers and each page buffer capable of searching M search data, the search bandwidth of the ternary content addressable memory 500 may be equal to N*M/Tread, where Tread is the computation time required for a search operation.

Please refer to FIG. 7, which illustrates a schematic plot of an approximation search mode for the ternary content addressable memory according to an embodiment of present disclosure. In this embodiment, a controller (such as the controller 430 is FIG. 4) may make, by intentionally or randomly, at least one search signal become a wildcard signal (X). In FIG. 7, search signals SB-9 and SB-25 are selected to be the wildcard signal (X), and each of the other search signals SB-1 to SB-8. SB-10 to SB-24 and SB26 to SB-32 is set to a logic state (1) or the logic state (0). Corresponding to the search signals SB-1 to SB-32, input signals with logic 1 or 0 may be set according to search level of corresponding search data and be input to the ternary content addressable memory cells of different groups Group-1 to Group-4. Page buffers PB-1 to PB-512 respectively include a plurality of counters for counting number of mismatches.

The ternary content addressable memory of this embodiment may choice the data which is fully match (no current) with the input signals under the exist of wildcard signal of the page buffers PB-1 to PB-512 to generate a final match result. In this case, a counting result of an exact matched page buffer (such as the page buffer PB-60) is 0.

On the other embodiments, the ternary content addressable memory of this embodiment may generate the final match result by compare each of the counting results with a preset threshold value (e.g. =2). If the each of the counting results is not larger than 2, each of the corresponding page buffer (such as page buffers PB-1, PB-2. PB-60, PB-511 and PB-512) may meet the criteria. The data stored in memory cells corresponding to the page buffers PB-1. PB-2, PB-60, PB-511 and PB-512 can be sent to a memory and/or a processor for continuously computing. The number of the wildcard signal for the search signals and the threshold value of the counting results are tunable by user requirements.

In summary, in the disclosure, paired memory cell strings are configured to construct a ternary content addressable memory, and the search signals are received by the memory cell string selection switches in the memory cell strings. Under such a condition, the ternary content addressable memories of the disclosure can perform successive search operations for multiple pieces of search data by receiving multiple search signals under one time of setting operation of the word line, thereby effectively improving the data search bandwidth of the ternary content addressable memory and the working efficiency of electronic devices.

What is claimed is:

1. A ternary content addressable memory comprising:
   a first memory cell string coupled between a matching line and a first source line and receiving a plurality of first word line signals, wherein the first memory cell string has a first memory cell string selection switch, and the first memory cell string selection switch is controlled by a first search signal; and
   a second memory cell string coupled between the matching line and the first source line and receiving a plurality of second word line signals, wherein the second memory cell string has a second memory cell string selection switch, and the second memory cell string selection switch is controlled by a second search signal,
   wherein control ends of the first memory cell string selection switch and the second memory cell string selection switch are respectively coupled to two different memory cell string selection lines for respectively receiving the first search signal and the second search signal,
   wherein a first selected word line in the first word line signals corresponds to a first selected memory cell, a second selected word line in the second word line signals corresponds to a second selected memory cell, the first selected word line generates a first comparison result according to data in the first selected memory cell and the first search signal, the first selected word line generates a second comparison result according to data in the second selected memory cell and the second search signal, and a matching signal on the matching line is determined according to the first comparison result and the second comparison result, wherein when the first memory cell string selection switch is cut off, the first comparison result is match, and when the second memory cell string selection switch is cut off, the second comparison result is match.

2. The ternary content addressable memory of claim 1, wherein when the first memory cell string selection switch is turned on, and the data in the first selected memory cell is the same as the first search signal, the first comparison result is match: when the second memory cell string selection switch is turned on, and the data in the second selected memory cell is the same as the second search signal, the second comparison result is match.

3. The ternary content addressable memory of claim 2, wherein when the first memory cell string selection switch is turned on, and the data in the first selected memory cell is different from the first search signal, the first comparison result is un-match; when the second memory cell string selection switch is turned on, and the data in the second selected memory cell is different from the second search signal, the second comparison result is un-match.

4. The ternary content addressable memory of claim 1, wherein the matching signal is pre-charged to a first reference voltage before a search operation, and during the search operation, when both the first comparison result and the second comparison result are un-matches, the matching signal is pulled down a second reference voltage; in the search operation, when both of the first comparison result and the second comparison result are match, the matching signal remains equal to the first reference voltage.

5. The ternary content addressable memory of claim 1, wherein the first search signal and the second search signal are complementary, or both the first search signal and the second search signal are logic low levels.

6. The ternary content addressable memory of claim 1, wherein the first search signal and the second search signal are generated according to search data.

7. A ternary content addressable memory comprising:
a plurality of memory cell string pairs receiving a plurality of search data, respectively, wherein each of the memory cell string pairs comprises:
  a first memory cell string coupled between a matching line and a first source line and receiving a plurality of first word line signals, wherein the first memory cell string has a first memory cell string selection switch, and the first memory cell string selection switch is controlled by a first search signal; and
  a second memory cell string coupled between the matching line and the first source line and receiving a plurality of second word line signals, wherein the second memory cell string has a second memory cell string selection switch, and the second memory cell string selection switch is controlled by a second search signal,
wherein the first search signal and the second search signal are generated according to each of the corresponding search data, wherein control ends of the first memory cell string selection switch and the second memory cell string selection switch are respectively coupled to two different memory cell string selection lines for respectively receiving the first search signal and the second search signal, wherein a first selected word line in the first word line signals corresponds to a first selected memory cell, a second selected word line in the second word line signals corresponds to a second selected memory cell, the first selected word line generates a first comparison result according to data in the first selected memory cell and the first search signal, the first selected word line generates a second comparison result according to data in the second selected memory cell and the second search signal, and a matching signal on the matching line is determined according to the first comparison result and the second comparison result, wherein when the first memory cell string selection switch is cut off, the first comparison result is match, and when the second memory cell string selection switch is cut off, the second comparison result is match.

8. The ternary content addressable memory of claim 7, wherein each of the search data is set to a first logic level, a second logic level, or a wild card signal.

9. The ternary content addressable memory of claim 8, wherein each of the corresponding first search signals is complementary to each of the corresponding second search signals when each of the search data is set to the first logic level or the second logic level, and each of the corresponding first search signals and each of the corresponding second search signals are the logic low levels when each of the search data is set as the wild card signal.

10. The ternary content addressable memory of claim 8, wherein at least one of the search data is the wild card signal.

11. The ternary content addressable memory of claim 10, further comprising:
a controller, selecting at least one of the search data as the wild card signal.

12. The ternary content addressable memory of claim 11, wherein the controller selects at least one of the search data as the wild card signal through a random mechanism.

13. The ternary content addressable memory of claim 7, further comprising:
a page buffer coupled to each of the memory cell string pairs, wherein the page buffer records a plurality of first cache values and a final cache value,
wherein the first cache values in the page buffer record search results corresponding to each of the search data, and the final cache value records a final search result.

14. The ternary content addressable memory of claim 13, wherein the page buffer performs logical operations on the first cache values to generate the final search result.

15. The ternary content addressable memory of claim 14, wherein the page buffer further comprises:
a counter for counting a number of times when the first cache value is equal to a specific logic level.

16. The ternary content addressable memory of claim 8, wherein the plurality of memory cell string pairs respectively receive the plurality of search data in different time phases.

17. The ternary content addressable memory of claim 15, wherein a search operation will be stopped when the number counted by the counter is same as a threshold number.

* * * * *